US010109328B2

(12) United States Patent
Nomura

(10) Patent No.: US 10,109,328 B2
(45) Date of Patent: Oct. 23, 2018

(54) MEMORY CONTROLLER FOR ADJUSTING TIMING BASED ON MEMORY POWER STATES

(71) Applicant: CANON KABUSHIKI KAISHA, Tokyo (JP)

(72) Inventor: Yoshihisa Nomura, Kashiwa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 334 days.

(21) Appl. No.: 14/904,438

(22) PCT Filed: Sep. 12, 2014

(86) PCT No.: PCT/JP2014/074763
§ 371 (c)(1),
(2) Date: Jan. 12, 2016

(87) PCT Pub. No.: WO2015/037746
PCT Pub. Date: Mar. 19, 2015

(65) Prior Publication Data
US 2016/0284385 A1    Sep. 29, 2016

(30) Foreign Application Priority Data

Sep. 13, 2013  (JP) .................................. 2013-190625

(51) Int. Cl.
G06F 1/32         (2006.01)
G06F 12/06        (2006.01)
(Continued)

(52) U.S. Cl.
CPC .......... *G11C 7/1072* (2013.01); *G06F 1/3284* (2013.01); *G06F 1/3287* (2013.01);
(Continued)

(58) Field of Classification Search
None
See application file for complete search history.

(56) References Cited

U.S. PATENT DOCUMENTS 6,510,099 B1 *  1/2003  Wilcox ............... G06F 13/1673
                                              365/189.05
8,756,394 B1 *  6/2014  Warner ............... G06F 13/1689
                                              710/58
(Continued)

FOREIGN PATENT DOCUMENTS

| JP | 2011059762 A | 3/2011 |
| JP | 2011158976 A | 8/2011 |
| JP | 2013058144 A | 3/2013 |

OTHER PUBLICATIONS

International Search Report issued in PCT/JP2014/074763, dated Dec. 2, 2014.
Written Opinion issued in PCT/JP2014/074763, dated Dec. 2, 2014.

*Primary Examiner* — Charles Rones
*Assistant Examiner* — Hewy H Li
(74) *Attorney, Agent, or Firm* — Rossi, Kimms & McDowell LLP

(57) ABSTRACT

A memory controller that enables reduction of calibration time. A memory controller controls a plurality of memory devices. A result of calibration on a memory configuration to be set at the start of a multifunction peripheral and results of calibration on other memory configurations than the memory configuration to be set at the startup of the multifunction peripheral are stored. Settings of the memory controller and settings of the memory devices are made using a result of calibration on the memory configuration adapted to the standby mode or the normal operation mode, which is selected from the stored calibration results.

5 Claims, 16 Drawing Sheets

(51) Int. Cl.
*G11C 7/20* (2006.01)
*H04N 1/21* (2006.01)
*G11C 7/10* (2006.01)
*G06F 13/16* (2006.01)

(52) U.S. Cl.
CPC ...... *G06F 12/0646* (2013.01); *G06F 13/1694* (2013.01); *H04N 1/21* (2013.01); *G11C 7/20* (2013.01); *G11C 2207/2254* (2013.01); *H04N 2201/0094* (2013.01)

(56) References Cited

U.S. PATENT DOCUMENTS

| | | | |
|---|---|---|---|
| 2002/0118578 A1* | 8/2002 | Janzen | G06F 13/1689 365/191 |
| 2003/0120848 A1* | 6/2003 | Horowitz | G06F 13/4072 710/104 |
| 2003/0140208 A1* | 7/2003 | LaBerge | G06F 13/1694 711/170 |
| 2013/0194873 A1 | 8/2013 | Chen | |
| 2014/0149775 A1* | 5/2014 | Ware | G06F 1/3293 713/323 |

\* cited by examiner

*FIG. 5*

| ADDRESS | VALUE | CONTENTS | |
|---|---|---|---|
| 02h | 0x0B | Memory Type (General) | DDR3 SDRAM |
| 04h | 0x02 | SDRAM device density and banks | 1Gb,8 banks |
| 14h | 0x1C | CAS latencies supported | CAS8,7,6 |
| 16h | 0x69 | Minimum CAS latency time(tAA_MIN) | 13.125ns |
| 17h | 0x78 | Minimum write recovery time(tWR_MIN) | 15ns |
| 18h | 0x69 | Minimum RAS to CAS delay(tRCD_MIN) | 13.125ns |

FIG. 6

| PARAMETER | | | MEMORY DEVICE 20 | MEMORY DEVICE 21 |
|---|---|---|---|---|
| SKEW VALUE BETWEEN CLK AND DQS SIGNALS IN WRITE ACCESS | degree | bank0 | 90 | 98 |
| | | bank1 | 92 | 99 |
| | | bank2 | 93 | 100 |
| | | bank3 | 95 | 101 |
| | | bank4 | 96 | 102 |
| | | bank5 | 98 | 104 |
| | | bank6 | 100 | 106 |
| | | bank7 | 101 | 107 |
| SKEW VALUE BETWEEN CLK AND DQS SIGNALS IN READ ACCESS | degree | bank0 | 270 | 252 |
| | | bank1 | 271 | 254 |
| | | bank2 | 273 | 255 |
| | | bank3 | 275 | 257 |
| | | bank4 | 277 | 258 |
| | | bank5 | 279 | 260 |
| | | bank6 | 281 | 261 |
| | | bank7 | 283 | 263 |
| READ LATENCY VALUE | cycle | | 7 | 8 |

FIG. 7

| PARAMETER | REQUIRED MEMORY CAPACITY[Mbit] | MEMORY DEVICE 20 | MEMORY DEVICE 21 |
|---|---|---|---|
| STANDBY MODE | 512 | POWER ON | POWER OFF |
| NORMAL OPERATION MODE | 2048 | POWER ON | POWER ON |

FIG. 8

| PARAMETER | | | MEMORY DEVICE 20 |
|---|---|---|---|
| SKEW VALUE BETWEEN CLK AND DQS SIGNALS IN WRITE ACCESS | degree | bank0 | 89 |
| | | bank1 | 91 |
| | | bank2 | 92 |
| | | bank3 | 93 |
| | | bank4 | 95 |
| | | bank5 | 98 |
| | | bank6 | 99 |
| | | bank7 | 100 |
| SKEW VALUE BETWEEN CLK AND DQS SIGNALS IN READ ACCESS | degree | bank0 | 265 |
| | | bank1 | 266 |
| | | bank2 | 268 |
| | | bank3 | 270 |
| | | bank4 | 271 |
| | | bank5 | 273 |
| | | bank6 | 275 |
| | | bank7 | 276 |
| READ LATENCY VALUE | cycle | | 7 |

*FIG. 12*

| ADDRESS | VALUE | CONTENTS | |
|---|---|---|---|
| 02h | 0x0B | Memory Type (General) | DDR3 MRAM |
| 04h | 0x02 | SDRAM device density and banks | 1Gb,8 banks |
| 12h | 0x0F | Minimum SDRAM cycle time(tCK_MIN) | 1.875ns |
| 14h | 0x1C | CAS latencies supported | CAS8,7,6 |
| 16h | 0x69 | Minimum CAS latency time(tAA_MIN) | 13.125ns |
| 17h | 0x78 | Minimum write recovery time(tWR_MIN) | 15ns |
| 18h | 0x69 | Minimum RAS to CAS delay(tRCD_MIN) | 13.125ns |

FIG. 13

| PARAMETER | | | MEMORY DEVICE 20 | MEMORY DEVICE 21 |
|---|---|---|---|---|
| SKEW VALUE BETWEEN CLK AND DQS SIGNALS IN WRITE ACCESS | degree | bank0 | 93 | 104 |
| | | bank1 | 97 | 104 |
| | | bank2 | 100 | 105 |
| | | bank3 | 102 | 110 |
| | | bank4 | 102 | 110 |
| | | bank5 | 102 | 110 |
| | | bank6 | 109 | 107 |
| | | bank7 | 111 | 111 |
| SKEW VALUE BETWEEN CLK AND DQS SIGNALS IN READ ACCESS | degree | bank0 | 279 | 261 |
| | | bank1 | 273 | 263 |
| | | bank2 | 274 | 258 |
| | | bank3 | 277 | 261 |
| | | bank4 | 280 | 264 |
| | | bank5 | 288 | 263 |
| | | bank6 | 283 | 264 |
| | | bank7 | 286 | 271 |
| READ LATENCY VALUE | cycle | | 8 | 8 |

FIG. 14

| PARAMETER | | | MEMORY DEVICE 20 |
|---|---|---|---|
| SKEW VALUE BETWEEN CLK AND DQS SIGNALS IN WRITE ACCESS | degree | bank0 | 93 |
| | | bank1 | 93 |
| | | bank2 | 96 |
| | | bank3 | 97 |
| | | bank4 | 96 |
| | | bank5 | 106 |
| | | bank6 | 104 |
| | | bank7 | 100 |
| SKEW VALUE BETWEEN CLK AND DQS SIGNALS IN READ ACCESS | degree | bank0 | 274 |
| | | bank1 | 269 |
| | | bank2 | 278 |
| | | bank3 | 270 |
| | | bank4 | 277 |
| | | bank5 | 276 |
| | | bank6 | 277 |
| | | bank7 | 276 |
| READ LATENCY VALUE | cycle | | 8 |

MEMORY CONTROLLER FOR ADJUSTING TIMING BASED ON MEMORY POWER STATES

TECHNICAL FIELD

The present invention relates to a memory controller that controls a plurality of memory devices and a printing apparatus including the memory controller, and more particularly to a memory controller that adjusts timing of writing and reading data in and from each memory device having a high-speed interface, and a printing apparatus including the memory controller.

BACKGROUND ART

In recent years, for a design of an LSI, there is a demand for a higher data transfer rate of a memory device, and this demand is met by using a synchronous memory device. Examples of the synchronous memory device include an SDRAM (Synchronous Dynamic Random Access Memory).

The SDRAM is operated in synchronism with a system clock (CLK) of the LSI. For example, the SDRAM receives control signals, such as a RAS signal, a CAS signal, and a WE signal, in synchronism with the rising edge of the CLK signal, determines a control command by combining 1 and 0 of these input signals, and further receives an address signal and a data signal as well in synchronism with the rising edge of the CLK signal.

An increased data transfer rate of the above-mentioned memory device causes a problem that to synchronize an input signal with the high-speed CLK signal, a setup time and a hold time of the input signal are shortened. To solve this problem, there has been proposed a technique using a data strobe signal (DQS) that notifies the synchronous memory device of timing at which the input signal, such as an address signal or a data signal, is sent to a first stage circuit thereof, with the aim of enabling the memory device to secure the setup time and the hold time of the input signal. Examples of the memory device using the DQS signal include a DDR(Double Data Rate)2 SDRAM and a DDR3 SDRAM.

Generally, a memory controller is interposed between the above-mentioned memory device and a CPU to adjust the timing of writing and reading data based on a result of printed circuit board simulation by taking into account the arrangement of wiring on a printed circuit board on which the memory device and other components are mounted.

This memory controller is required to perform timing adjustment with higher accuracy in accordance with the increase in the speed of the CLK signal based on which it performs synchronization, and further is required to perform timing adjustment by taking into account processing accuracy variation caused by LSI miniaturization, lowered power supply voltage of the internal circuit of the LSI for reduced power consumption of the LSI, and variation in delay time of input/output buffers which vary with the temperature of the printed circuit board and other factors. In addition, to absorb variation in delay time which varies with the difference between individual input/output buffers, it is necessary to adjust the delay time after LSI assembly.

For example, to write and read data in and from a high-speed memory device, the memory controller is required to perform appropriate timing adjustment particularly for a circuit part that holds read data output from the memory device in an internal flip-flop, a circuit part that synchronizes the read data held in this flip-flop with the CLK signal, and so forth.

The memory controller calculates a round trip delay which is a time period taken for a CLK signal output from the memory controller to return to the memory controller by way of the memory device, as a DQS signal, so as to determine an effective range of read data synchronized with the CLK signal.

When the memory controller is a DDR3 SDRAM, it has a write leveling function and a read leveling function for adjusting write/read access timing, according to JEDEC specifications.

In the write leveling function, when write leveling enable of an MR1 register of the memory device is set to 1, the memory controller outputs a value of a skew between the CLK and DQS signals. More specifically, the memory device samples the CLK signal at a rising edge of the DQS signal issued by the memory controller, and returns 1 to a data signal (DQ) synchronized with the DQS signal. The memory controller gradually changes the phase difference between the CLK and DQS signals, and adjusts timing based on the result of the DQ signal such that the maximum margin in timing can be provided (see FIGS. 17A and 17B).

FIGS. 17A and 17B are timing diagrams of the CLK and DQS signals in each of the memory controller and the memory device, in which FIG. 17A shows signals before the memory controller performs timing adjustment, and FIG. 17B shows the signals after the memory controller has performed timing adjustment.

Referring to FIG. 17A, in a case where the memory controller outputs the DQS signal in a manner synchronizing the rising timing of the DQS signal with the rising timing of the CLK signal, the CLK and DQS signals in the memory device are different in rising timing due to influence of wiring length, wiring load, and the like, whereby the memory device cannot sample the CLK signal at the rising edge of the DQS signal, and hence the memory device returns 0 to the DQ signal. Further, the memory controller shifts the output timing of the DQS signal from that of the CLK signal to thereby search for a point at which the DQ signal is changed from 0 to 1 as shown in FIG. 17B. When the memory device returns 1 to the DQ signal, this indicates that the CLK signal has been sampled at the rising edge of the DQS signal.

On the other hand, in the read leveling function, when the memory controller is set as an MPR (Multipurpose Register), the memory device holds and outputs a predetermined data pattern, whereby the memory controller is made capable of knowing timing for receiving the data pattern, and hence the memory controller can adjust latency between the issuing of a read command and the return of read data after the issuing of the read command.

In read access, the memory device outputs the DQS signal, and the memory controller detects the number of cycles from the issuing of the read command to the receiving of data, and gradually shifts the timing of reading the read data from the timing at which the DQS signal is internally detected, to thereby detect the optimum point of change so as to adjust the skew value between the CLK and DQS signals.

Further, the memory controller improves signal quality by issuing a ZQ calibration command to perform correction dependent on PVT (process, voltage, and temperature) changes occurring during operation, and also by ODT (On Die Termination).

However, execution of calibration at the startup of the apparatus or during operation by the memory controller affects data transfer between the memory device and the CPU, which causes a problem that the performance is degraded.

To solve this problem, it has been envisaged to set parameters using a calibration method adapted to environmental changes occurring within an apparatus (for example, see PTL 1 below).

In the technique disclosed in PTL 1, unless there is a large change in temperature measured at every preset time or at predetermined time intervals, the calibration time is reduced by executing calibration in a simplified manner or by using a preset value stored in the memory device.

On the other hand, information apparatuses, including cellular phones and smart phones, have been made increasingly multifunctional, and this causes a serious problem of increased power consumption of an LSI in these information apparatuses.

For this reason, there is a demand for designing memory devices incorporated in the LSI in a manner adapted to low-power consumption by shifting some of the memory devices to a sleep mode or turning off some of the memory devices.

In a case where some of the memory devices are turned off, volatile memory devices cannot hold data without power supply, and hence it is necessary to save data to a nonvolatile memory device which can hold data even after interruption of power. This causes a problem that when a memory device is powered off for an energy saving mode of the LSI, it takes execution time to save the data stored therein in the nonvolatile memory device.

To solve this problem, there has been developed, for example, an MRAM (Magnetoresistive Random Access Memory) which is a nonvolatile memory device, as an alternative to the volatile memory device, such as a DDR3.

The MRAM is capable of performing high-speed communication, and further, magnetically holding data even after the memory device is powered off, and hence the data is not required to be saved in another nonvolatile memory device differently from the above-mentioned volatile memory device. Therefore, even when the memory device is powered off for the energy saving mode of the LSI, it is possible to eliminate the time required for saving the data in another memory device.

To this end, there has been proposed a technique that makes it possible to realize high-speed start by storing a startup program in the MRAM at the first time of power on, and executing the startup program stored in the MRAM at each subsequent time of power on.

CITATION LIST

Patent Literature

PTL 1: Japanese Patent Laid-Open Publication No. 2011-59762

SUMMARY OF INVENTION

Technical Problem

However, in a case where some of the memory devices connected to a memory bus are powered off when the apparatus equipped with the memory devices is in an activated state, the wiring load capacity of the memory bus is changed and hence calibration of the memory devices is required so as to adapt them to the change in wiring load capacity. At this time, it is necessary to execute the same calibration as executed at the startup of the apparatus again, and hence it is impossible to reduce the calibration time.

The present invention provides a memory controller that makes it possible to reduce the calibration time, and a printing apparatus including the memory controller.

Solution to Problem

Accordingly, in a first aspect of the present invention, there is provided a memory controller that controls a plurality of memory devices, comprising an on/off-switching control unit configured to control on/off-switching of power supply of at least one of the plurality of memory devices, a memory configuration-setting unit configured to set a memory configuration by the on/off-switching control unit, a calibration unit configured to execute calibration on all types of the memory configuration set by the memory configuration-setting unit, a storage unit configured to store results of calibration executed by the calibration unit, and a setting unit configured to make settings of the memory controller and the memory devices, based on one of the results of calibration stored by the storage unit.

Accordingly, in a second aspect of the present invention, there is provided a printing apparatus including a plurality of memory devices, a memory controller configured to control the plurality of memory devices, and a central processing unit configured to control the plurality of memory devices and the memory controller, wherein the central processing unit comprises an on/off-switching control unit configured to control on/off-switching of power supply of at least one of the plurality of memory devices, a memory configuration-setting unit configured to set a memory configuration by the on/off-switching control unit, a calibration control unit configured to cause the memory controller to execute calibration on all types of the memory configuration set by the memory configuration-setting unit, a storage unit configured to store results of calibration which the calibration control unit has caused the memory controller to execute, and a setting control unit configured to control the memory controller to thereby cause the memory controller to make settings of the memory controller and settings of at least one of the plurality of memory device, based on one of the results of calibration stored by the storage unit.

Advantageous Effects of Invention

According to the present invention, it is possible to reduce the calibration time.

Further features of the present invention will become apparent from the following description of exemplary embodiments (with reference to the attached drawings).

BRIEF DESCRIPTION OF DRAWINGS

FIG. 5 is a table showing an example of information read by the memory controller shown in FIG. 3 from an SPD of a memory device appearing in FIG. 2.

FIG. 6 is a table showing an example of a result of calibration of memory configuration in a normal operation mode, which is stored in a step of the calibration result-storing process shown in FIG. 4.

FIG. 7 is a table showing an example of settings of memory configuration switching made in a step of the calibration result-storing process shown in FIG. 4.

FIG. 8 is a table showing an example of a result of calibration of memory configuration in a standby mode, which is stored in a step of the calibration result-storing process shown in FIG. 4.

FIG. 12 is a table showing an example of information read by the CPU appearing in FIG. 10 from an SPD of the memory device.

FIG. 13 is a table showing an example of a result of calibration of memory configuration in the normal mode, which is stored in a step of the calibration result-storing process shown in FIG. 11, in the variation.

FIG. 14 is a table showing an example of a result of calibration of memory configuration in the standby mode, which is stored in a step of the calibration result-storing process shown in FIG. 11, in the variation.

DESCRIPTION OF EMBODIMENTS

The present invention will now be described in detail below with reference to the drawings showing an embodiment thereof.

Figure 1:
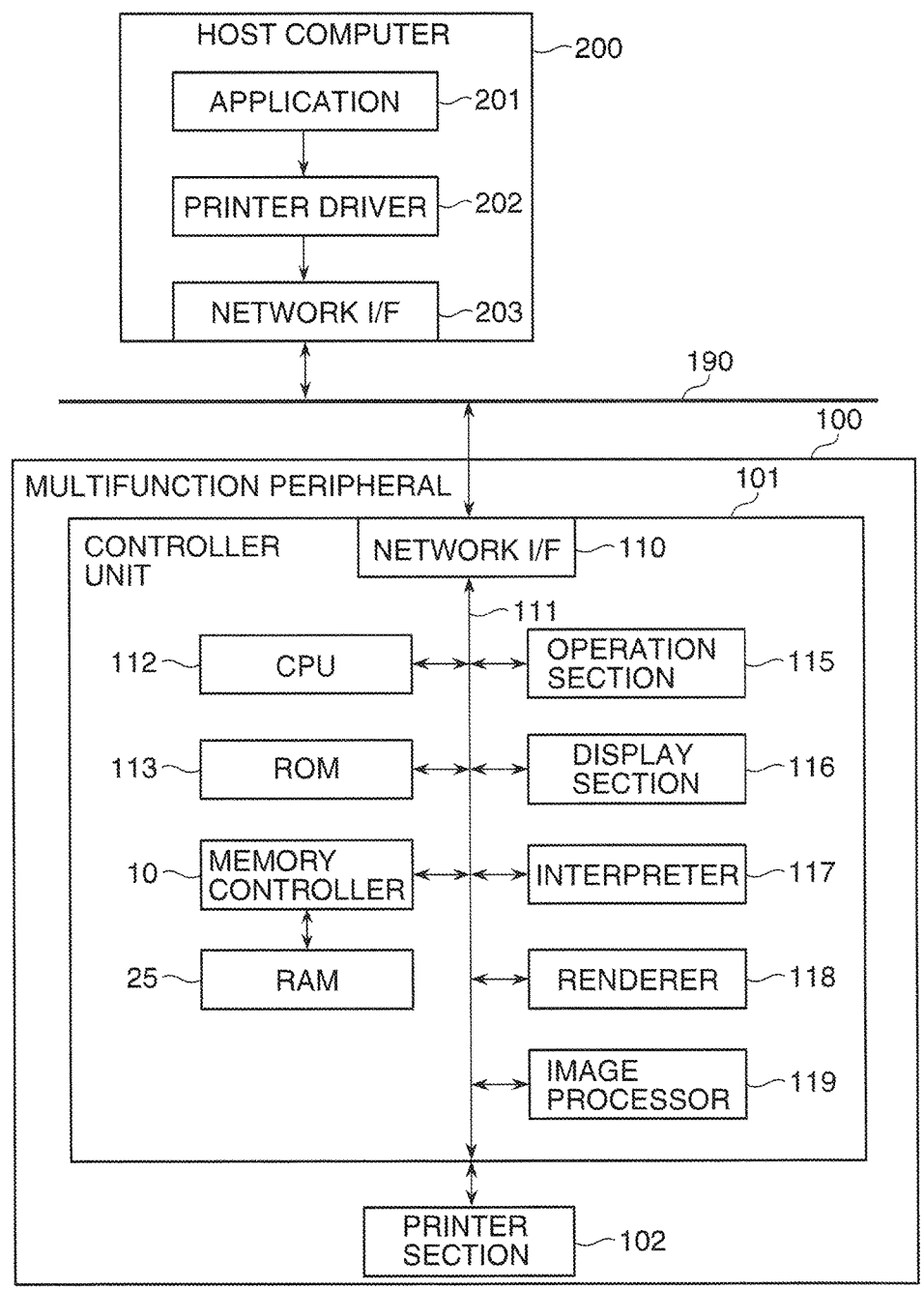
FIG. 1 is a schematic block diagram of a network system including a multifunction peripheral equipped with a memory controller according to an embodiment of the present invention.

FIG. 1 is a schematic block diagram of a network system including a multifunction peripheral 100 equipped with a memory controller 10 according to an embodiment of the present invention.

The network system shown in FIG. 1 is comprised of the multifunction peripheral 100 and a host computer 200, which are connected to each other via an external network 190.

The host computer 200 is comprised of an application 201, a printer driver 202, and a network interface 203, which are serially connected to each other.

The application 201 is operated on the host computer 200, and creates digital document data, such as a page layout document, a word processor document, and a graphic document. The digital document data created by the application 201 is sent to the printer driver 202, and the printer driver 202 generates a drawing command based on the received digital document data.

This drawing command generally uses a printer description language called a PDL (Page Description Language) for creating page image data. The drawing command used in the present embodiment normally includes instructions for drawing data, such as characters, graphics, and images.

The network interface 203 transmits the drawing command generated by the printer driver 202 to the multifunction peripheral 100 via the external network 190.

The multifunction peripheral 100 is comprised of a controller unit 101 and a printer section 102. Upon receipt of the drawing command from the host computer 200, the multifunction peripheral 100 performs processing for converting the received drawing command to image data which can be output, and printing the image data on a sheet surface.

The controller unit 101 includes a network interface 110, a CPU 112, a ROM 113, the memory controller 10, an operation section 115, a display section 116, an interpreter 117, a renderer 118, and an image processor 119, which are interconnected via a data bus 111. The controller unit 101 further includes a RAM 25 connected to the memory controller 10.

The network interface 110 is connected as an interface module to the external network 190, and performs bidirectional data communication, based on a communication protocol, such as Ethernet (registered trademark), for receiving a drawing command from another device and transmitting device information (jam information, sheet size information, etc.) of the multifunction peripheral 100, via the network 190.

Program data stored in the ROM 113 is loaded into the RAM 25 to be temporarily stored therein, and the RAM also temporarily stores data generated when each module executes a command, and like other data.

The CPU (central processing unit) 112 controls the components of the controller unit 101 according to the program loaded into the RAM 25 to thereby cause the multifunction peripheral 100 to operate.

The operation section 115 provides interface for receiving an input from a user. The display section 116 displays a UI (User Interface) screen that shows a prompt to a user, and a state of the multifunction peripheral 100. The interpreter 117 interprets a drawing command received via the network interface 110, and generates intermediate language data.

The renderer 118 generates a raster image based on the intermediate language data generated by the interpreter 117. The image processor 119 performs image processing on the raster image generated by the renderer 118, such as color conversion processing, γ correction processing using a lookup table, and pseudo intermediate processing, to thereby convert the raster image to image data which can be output.

The memory controller 10 controls data transmission and reception to and from the RAM 25. The memory controller 10 will be described in detail hereinafter with reference to FIGS. 2 to 9.

The printer section 102 is connected to the controller unit 101, and forms image data on a sheet surface using toner, based on the image data converted by the image processor 119.

Although the controller unit 101 according to the present embodiment has the components configured as the hardware, the CPU 112 may execute processing of each component based on the program stored in the ROM 113. In this case, this program also has functions for writing and reading data to and from the RAM 25.

Figure 2:
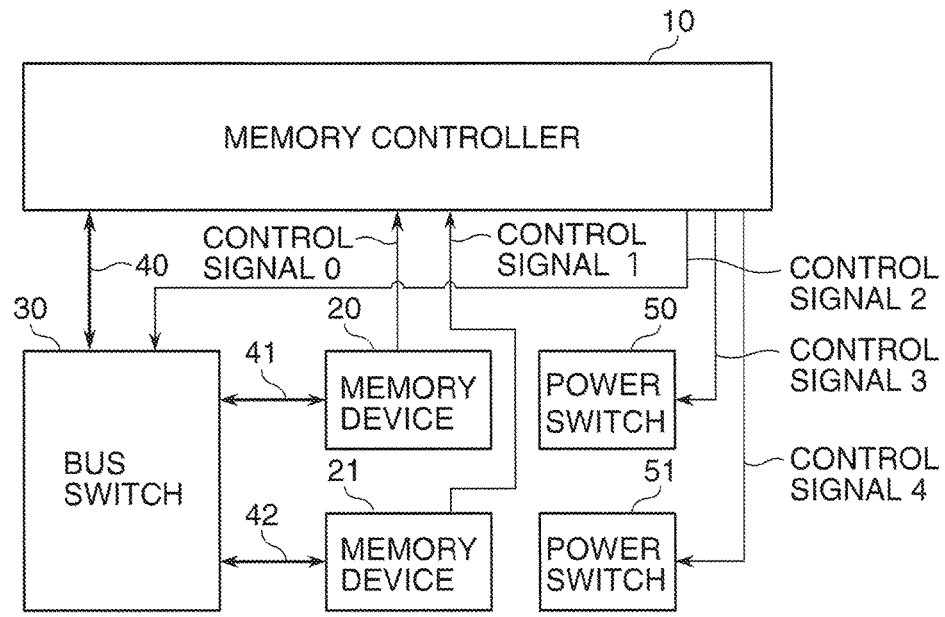
FIG. 2 is a block diagram useful in explaining the operation of the memory controller appearing in FIG. 1.

FIG. 2 is a block diagram useful in explaining the operation of the memory controller 10 appearing in FIG. 1.

Referring to FIG. 2, the memory controller 10 is connected to a bus switch 30 via a memory bus 40. A memory device 20 and a memory device 21 are connected to the bus switch 30 via a memory bus 41 and a memory bus 42, respectively.

The memory bus 40 is a high-speed communication bus for connecting the memory controller 10 and the bus switch 30, and the memory buses 41 and 42 are high-speed communication buses for connecting the bus switch 30, and the memory devices 20 and 21, respectively.

The memory controller 10 controls the memory devices 20 and 21. The memory controller 10 accesses the memory devices 20 and 21 via the bus switch 30 to execute calibration for performing timing adjustment of write/read access for performing high-speed communication with the memory devices 20 and 21, and perform bus switching of the bus switch 30, and power supply switching control for power switches 50 and 51.

The memory devices 20 and 21, each of which is comprised of an input/output buffer and an internal circuit, are capable of reading and writing data according to a predetermined protocol, and form a memory module in which each of the memory devices 20 and 21 has an SPD (Serial Presence Detect). Further, the memory devices 20 and 21 are each formed by a DDR3.

The memory devices 20 and 21 may each be formed by a volatile memory device, such as an SDRAM, a DDR, a DDR2, a DDR4, and an SRAM, or a nonvolatile memory device, such as a flash ROM and an MRAM, and may form a memory module by incorporating a plurality of memory devices of the above-mentioned two or more types.

The memory devices 20 and 21 send control signals 0 and 1 to the memory controller 10, and the memory controller 10 sends a control signal 2 to the bus switch 30, a control signal 3 to the power switch 50, and a control signal 4 to the power switch 51, respectively.

The bus switch 30 is a circuit for switching connection of terminals between the memory bus 40 and the memory buses 41 and 42. The bus switch 30 can connect both or only one of the memory buses 41 and 42 to the memory bus 40 based on the control signal 2 received from the memory controller 10. It is preferable that the bus switch 30 or each of the memory devices 20 and 21 incorporates a circuit for performing, when one of the memory buses 41 and 42 is disconnected, termination processing of the disconnected terminal so as to prevent degradation of the waveform quality of a signal from the other of the memory buses 41 and 42. Further, when the memory devices 20 and 21 are powered off, each may have the input/output buffer powered on and only the internal circuit powered off.

The power switch 50 is a switch for controlling switching on/off of the memory device 20 according to the control signal 3 output from the memory controller 10, and the power switch 51 is a switch for controlling switching on/off of the memory device 21 according to the control signal 4 output from the memory controller 10.

Figure 3:
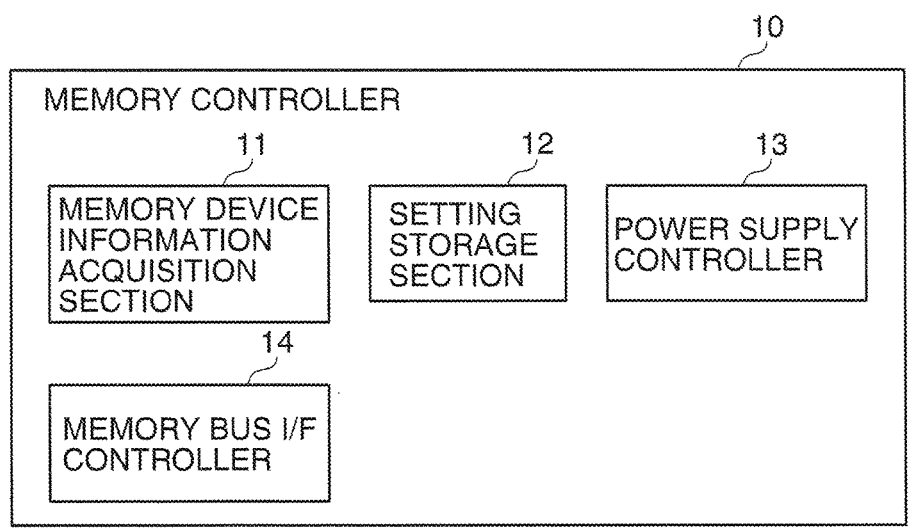
FIG. 3 is a schematic block diagram of the memory controller appearing in FIG. 2.

FIG. 3 is a schematic block diagram of the memory controller 10 appearing in FIG. 2.

Referring to FIG. 3, the memory controller 10 includes a memory device information acquisition section 11, a setting storage section 12, a power supply controller 13, and a memory bus interface controller 14.

The memory device information acquisition section 11 acquires, by the control signals 0 and 1, information on the memory devices 20 and 21, for example, from the SPD mounted in each memory device, information on the memory device, such as the maximum clock frequency, the memory capacity, and the signal timing. The memory device information acquisition section 11 may acquire the memory device information using an operation program of an external CPU, not shown.

The setting storage section 12 stores results of calibration. For example, the setting storage section 12 stores a skew value between CLK and DQS signals as a result of write leveling, and a read latency value as a result of read leveling. The setting storage section 12 can store a result of calibration on a memory device-by-memory device basis, and further can store a result of calibration on each of memory configurations which are switched depending on the power on/off state of each of the memory devices 20 and 21. For example, in the configuration shown in FIG. 2, there are considered three types of the memory configuration in which the memory devices 20 and 21 are powered on and off, off and on, and on and on, respectively, and the setting storage section 12 can store a result of calibration performed for each type of the memory configuration.

The power supply controller 13 controls the power switches 50 and 51, based on the memory module information acquired by the memory device information acquisition section 11, using the control signals 3 and 4, to thereby turn on or off the memory devices 20 and 21, respectively.

The memory bus interface controller 14 controls the bus switch 30 using the control signal 2 to thereby switch connection between the memory bus 40 and the memory buses 41 and 42, as mentioned hereinabove.

To set a memory configuration in which the memory devices 20 and 21 are both in the power-on state, the power supply controller 13 controls the power switches 50 and 51 using the control signals 3 and 4 to thereby power on the memory devices 20 and 21, respectively, and the memory bus interface controller 14 controls the bus switch 30 using the control signal 2 to thereby connect the memory bus 40 and the memory buses 41 and 42.

Further, to set a memory configuration in which only the memory device 20 is in the power-on state, the memory bus interface controller 14 controls the bus switch 30 using the control signal 2 to thereby disconnect the memory bus 40 from the memory bus 42, and the power supply controller 13 controls the power switch 51 using the control signal 4 to thereby power off the memory device 21.

Note that the power-on/off control performed by the supply controller 13, and the control of the bus switch 30 performed by the memory bus interface controller 14 are executed when memory accesses to the memory devices 20 and 21 are not being executed.

The control signals 3 and 4 may be transmitted not from the memory controller 10, but from an external CPU, not shown.

Figure 4:
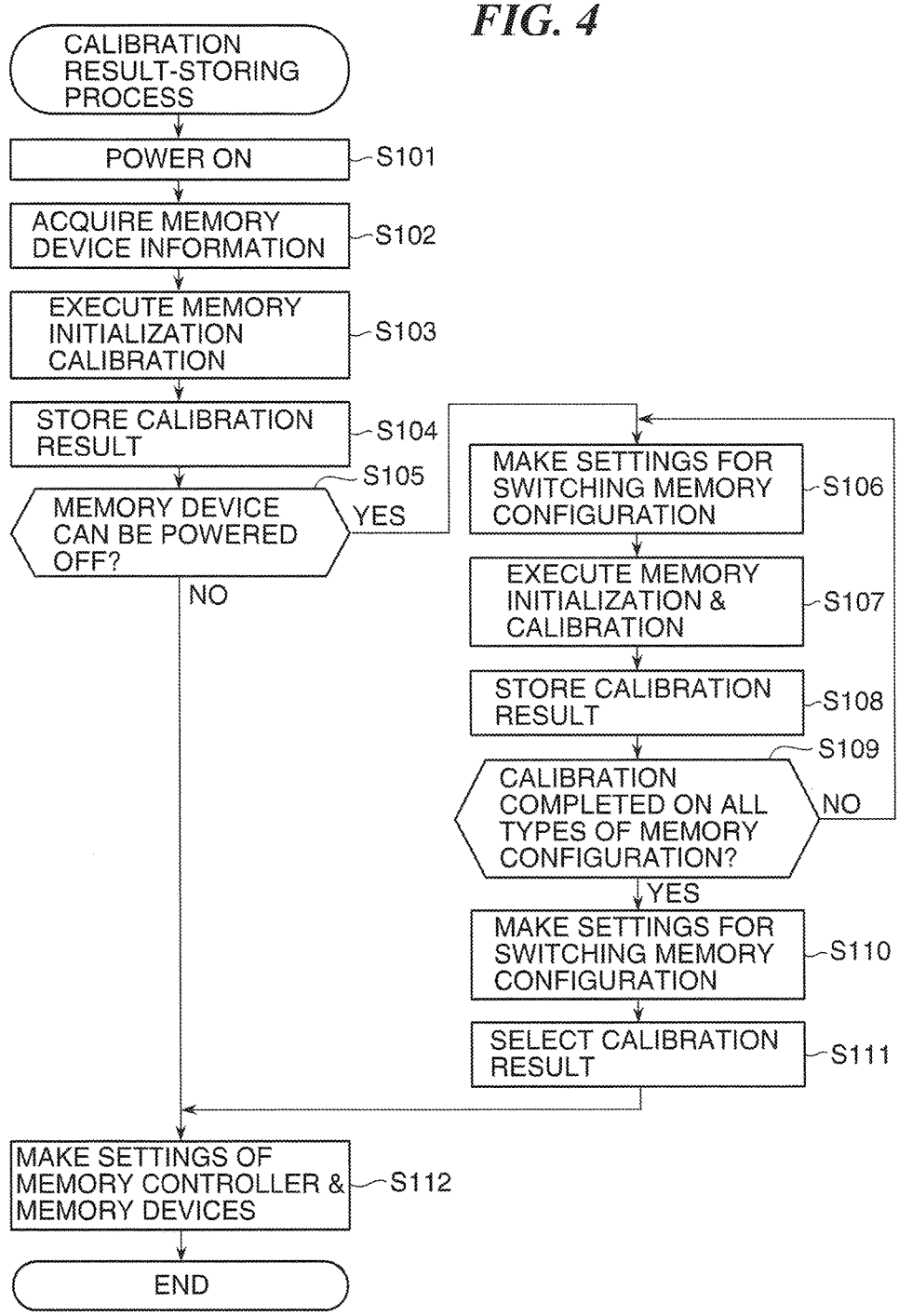
FIG. 4 is a flowchart of a calibration result-storing process executed by the memory controller shown in FIG. 3.

FIG. 4 is a flowchart of a calibration result-storing process performed by the memory controller 10 shown in FIG. 3.

The calibration result-storing process in FIG. 4 is a process executed by the memory controller 10 at the startup of the multifunction peripheral 100, in which the memory controller 10 stores a result of calibration performed with a memory configuration set at the startup of the multifunction peripheral 100, then stores a result of calibration performed on a memory configuration other than the memory configuration set at the startup of the multifunction peripheral 100, and, after setting the memory configuration back to the one set at the startup of the multifunction peripheral 100, makes settings of its own and settings of the memory devices 20 and 21, using the stored calibration results.

Although in the present embodiment, it is possible to power on or off one of the memory devices 20 and 21, the following description is given assuming that only the memory device 21 is powered on or off.

Referring to FIG. 4, first, when the power is turned on at the startup of the multifunction peripheral 100, the memory controller 10 sends the control signals 3 and 4 to the power switches 50 and 51, respectively, so as to simultaneously power on the power switches 50 and 51 as well (step S101). Then, the memory controller 10 reads information on the memory device 20 from the SPD of the memory device 20 using the control signal 0, and similarly reads information on the memory device 21 from the SPD of the memory device 21 using the control signal 1 to thereby acquire the memory device information shown in FIG. 5 (step S102). The memory controller 10 stores the acquired memory device information in the memory device information acquisition section 11, and recognizes each of the memory devices 20 and 21 as a 1-Gbit 8-bank DDR3 SDRAM. Note that since the memory devices 20 and 21 are each formed by the same DDR3 SDRAM, FIG. 5 shows information on the same DDR3 SDRAM.

Note that the information shown in FIG. 5 is only an illustrated example, and the actual information includes necessary items other than the shown items, such as an item of a timing parameter.

Referring back to FIG. 4, the memory controller 10 performs memory initialization calibration on the memory module having the memory configuration set at the startup of the multifunction peripheral 100 so as to adjust both of write leveling and read leveling (step S103). In this example, the memory module is formed by the memory devices 20 and 21.

Then, the memory controller 10 stores a skew value between the CLK and DQS signals as to each bank of the memory devices 20 and 21 during write access and read access, and a read latency value, in the setting storage section 12 as the calibration result shown in FIG. 6 (step S104), and determines based on the required memory capacity whether or not one of the memory devices 20 and 21 can be powered off so as to reduce power consumption (step S105). This determination is performed by determining, based on the memory capacity in the acquired memory device information ("1 Gbit" indicated in an address 04h in the example shown in FIG. 5), whether or not, even when one of the memory devices 20 and 21 is powered off, the other of the memory devices 20 and 21 has a sufficient capacity for a predetermined value of the capacity required by the software for each operation mode (a standby mode and a normal operation mode).

If it is determined in the step S105 that one of the memory devices 20 and 21 can be powered off, the memory controller 10 makes settings for switching the memory configuration, described hereinafter with reference to FIG. 7, based on the memory device information acquired in the step S102, using the control signals 2, 3, and 4 so as to perform calibration on memory configurations other than the one set at the startup of the multifunction peripheral 100 (this operation corresponds to an operation of a memory configuration-setting unit), and sequentially performs calibration according to the settings shown in FIG. 7 (step S106).

In the settings shown in FIG. 7, in advance, the memory capacity required for the standby mode is set to 512 Mbits and the memory capacity required for the normal operation mode is set to 2048 Mbits. The memory controller 10 determines, based on the memory capacity of the memory device information acquired in the step S102, that only the memory device 20 is required to be powered on (the other can be turned off) during the standby mode, and both of the memory devices 20 and 21 are required to be powered on (neither of them can be powered off) during the normal operation mode. Note that the required memory capacity is set in a program stored in the ROM 113.

In the present embodiment, the memory controller 10 controls the control signals 2 and 4 to thereby set the respective two types of memory configuration for the standby mode and the normal operation mode, in the settings shown in FIG. 7. The bus switch 30 performs termination processing of the terminal of the memory bus 42 inside the bus switch 30 so as to ensure the signal quality of the memory buses 40 and 41 when the memory configuration is set to the one for the standby mode in which only the memory device 20 is in the power-on state.

Referring back to FIG. 4, the memory controller 10 performs memory initialization and calibration on each of the memory devices 20 and 21 (step S107), and stores a calibration result, shown in FIG. 8, which has been obtained on the memory configuration in which only the memory device 20 is in the power-on state, in the setting storage section 12 (step S108). When calibration has been completed on all types of the memory configuration in which the memory devices 20 and 21 are powered on and off, off and on, and on and on, respectively (YES to a step S109), the memory controller 10 makes settings for switching the memory configuration so as to set the memory configuration back to the one set at the startup of the multifunction peripheral 100 using the same method as used in the step S106 (step S110).

In a step S111 following the step S110, the memory controller 10 selects a calibration result on the memory configuration adapted to the standby mode or the normal operation mode, out of the stored calibration results (for example, when the memory configuration for the standby mode is set at the startup, the memory controller 10 selects the calibration result in FIG. 8, which is a result of calibration performed on the memory configuration for the standby mode), and makes settings of its own and settings of the memory devices 20 and 21, using the selected calibration result (step S112), followed by terminating the present process.

If it is determined in the step S105 that neither of the memory devices 20 and 21 can be powered off, the memory controller 10 is not required to switch the memory configuration during operation of the multifunction peripheral 100, and hence immediately execute the step S112, followed by terminating the preset process.

According to the calibration result-storing process in FIG. 4, the result of calibration performed on the memory configuration set at the startup of the multifunction peripheral 100 (FIG. 6) and the result of calibration performed on the memory configuration other than the memory configuration set at the startup of the multifunction peripheral 100 (FIG. 8) are stored, respectively (step S104 and S108), and the settings of the memory controller 10 and the settings of the memory devices 20 and 21 are made using, out of the stored calibration results, the result of calibration performed on the memory configuration adapted to the standby mode or the normal operation mode (step S112). Therefore, it is possible to omit calibration time conventionally required when switching of the memory configuration is executed which is involved in switching of the operation mode of the multifunction peripheral 100 during operation thereof after startup, as will be described hereinafter with reference to FIG. 9.

For example, in the step S111, the memory controller 10 selects timing parameters (i.e. skew values) each of which have the maximum margins in write access and read access, respectively, out of a plurality of skew values between the CLK and DQS signals during write access and read access, which form the calibration result in FIG. 8.

Further, although in the calibration result-storing process in FIG. 4, whether or not to power off one of the memory devices 20 and 21 is determined based on the memory capacity of the acquired memory device information (step S102), this may be determined based on a setting set in advance in an operation mode-setting register provided in the memory controller 10. In other words, when the memory device information shown in FIG. 5 can be acquired, the determination may be made based on the acquired information, whereas when such memory device information is not available, the determination may be made based on a setting set in the operation mode-setting register provided in the memory controller 10.

Figure 9:
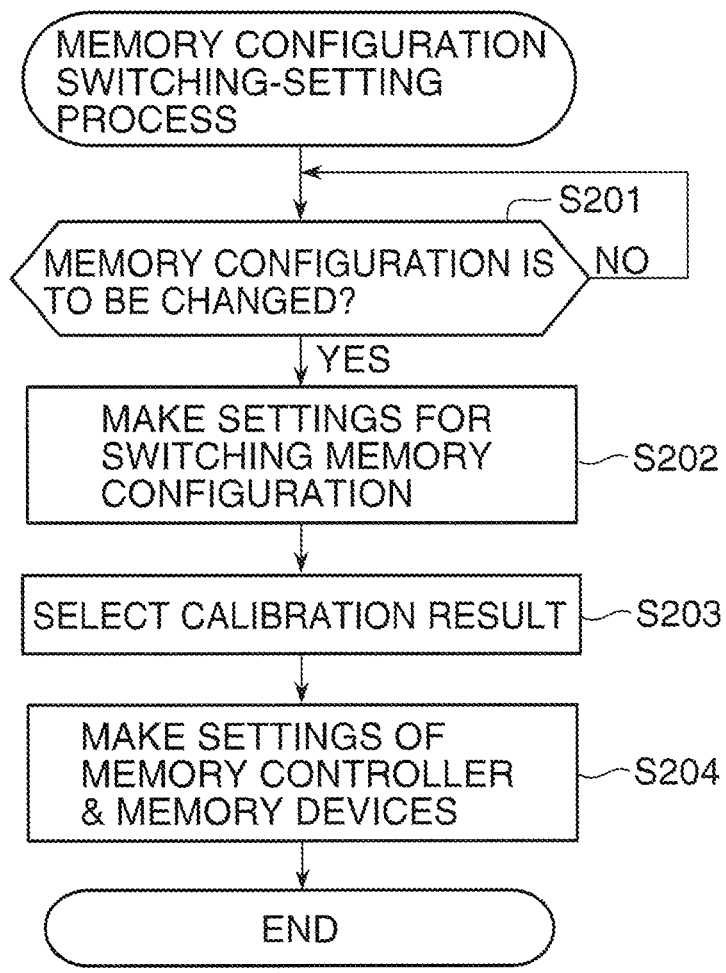
FIG. 9 is a flowchart of a memory configuration switching-setting process executed by the memory controller shown in FIG. 3.

FIG. 9 is a flowchart of a memory configuration switching-setting process performed by the memory controller 10 shown in FIG. 3.

The memory configuration switching-setting process in FIG. 9 is a process performed when the power supply settings of the memory devices 20 and 21 are changed by the memory controller 10 during operation of the multifunction peripheral 100 after startup.

The following description will be given of a case where the memory controller 10 changes the power supply settings for the standby mode to those for the normal operation mode, by way of example.

Referring to FIG. 9, first, if the memory controller 10 determines, based on the control signals 0 and 1 input to the memory controller 10, that the memory configuration is required to be switched from one for the standby mode to one for the normal operation mode (YES to a step S201), the memory controller 10 makes the settings for switching the memory configuration based on the control signals 2 and 4 (step S202), selects a calibration result on the memory configuration for the normal operation mode out of the calibration results stored in the step S104 or S108 in FIG. 4 (step S203), and makes settings of its own and settings of the memory devices 20 and 21, using the calibration result selected in the step S203 (step S204), followed by terminating the present process.

In the step S203, the memory controller 10 selects, for example, timing parameters (i.e. skew values) each of which have the maximum margins in write access and read access, respectively, out of a plurality of skew values between the CLK and DQS signals during write access and read access, which form the calibration result in FIG. 6.

In contrast to the above description given of the case where the memory controller 10 changes the power supply settings for the standby mode to those for the normal operation mode, by way of example, in a case where the memory controller 10 changes the power supply settings from those for the normal operation mode to those for the standby mode, the memory controller 10 selects a calibration result on the memory configuration for the standby mode out of the calibration results stored in the step S104 or S108 in FIG. 4 (step S203), and makes settings of its own and settings of the memory devices 20 and 21, using the calibration result on the memory configuration for the standby mode (step S204).

According to the memory configuration switching-setting process in FIG. 9, the settings of the memory controller 10 and the settings of the memory devices 20 and 21 are made using the calibration result on the memory configuration adapted to the standby mode or the normal operation mode out of the calibration results stored at the startup of the multifunction peripheral 100 (step S204), and hence it is possible to reduce the calibration time even when the power supply settings of the memory devices 20 and 21 are changed during operation of the multifunction peripheral 100.

Note that the memory controller 10 executes switching of the memory configuration only after judging that the memory controller 10 itself is not performing memory access to the memory devices 20 and 21.

Although in the present embodiment, it is assumed that calibration is performed when the power of the multifunction peripheral 100 is turned on (steps S103 and S107 in FIG. 4), in a case where the power supply settings are changed by the memory controller 10 during operation of the multifunction peripheral 100 after startup, if, in such a case, the memory device information is found to have been changed when the information is read from the respective SPDs of the memory devices 20 and 21 in the power-on state (this operation corresponds to an operation of an information update unit), calibration may be executed again to thereby update the calibration results (this operation corresponds to an operation of a calibration result update unit).

Next, a description will be given of a variation of the present embodiment.

Figure 10:
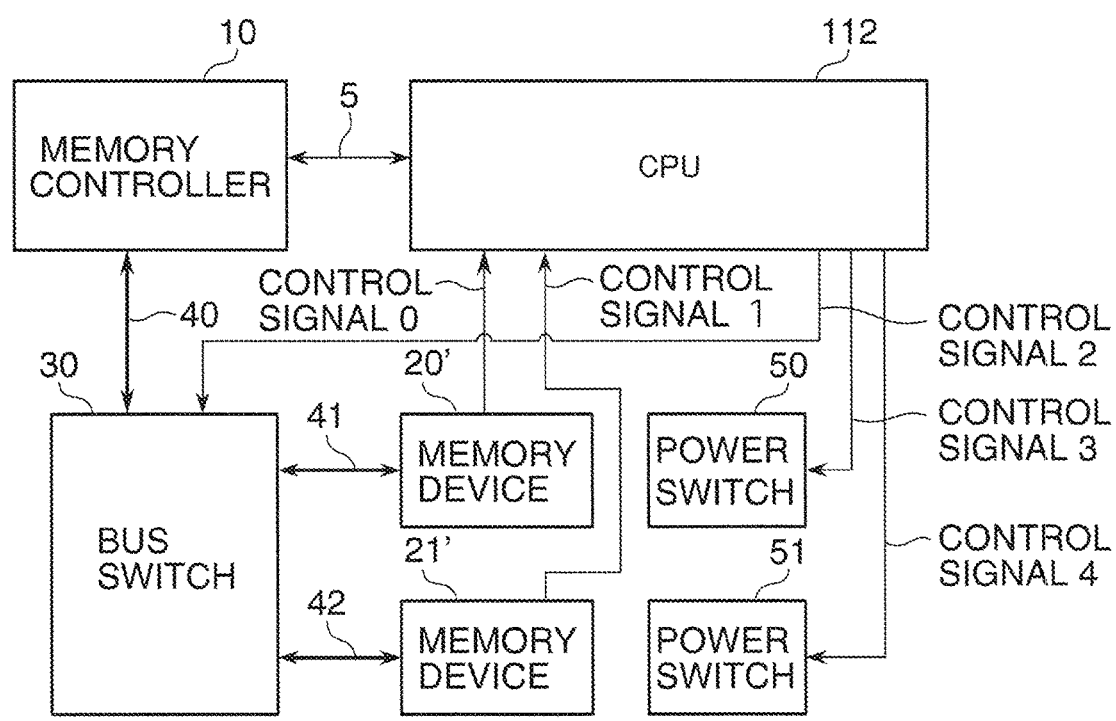
FIG. 10 is a block diagram useful in explaining the operations of a CPU and the memory controller according to a variation of the present embodiment.

FIG. 10 is a block diagram useful in explaining the operations of the CPU 112 and the memory controller 10 according to the variation of the present embodiment.

Referring to FIG. 10, the memory controller 10 is connected to the bus switch 30 via the memory bus 40, and is connected to the CPU 112 via a control bus 5. A memory device 20' and a memory device 21' are connected to the bus switch 30 via the memory bus 41 and the memory bus 42, respectively. The same components in FIG. 10 as those in FIG. 2 are denoted by the same reference numerals, and description thereof is omitted. The following description will be mainly given of different components.

The memory controller 10 in FIG. 10 does not include the power supply controller 13 and the memory bus interface controller 14 in FIG. 3. The memory devices 20' and 21' are MRAMs capable of reading and writing data according to a predetermined protocol, and are nonvolatile memory devices which have functions equivalent to those of the DDR3 SDRAM and are capable of holding settings of various modes and parameters, and data, even when the memory devices 20' and 21' are in the power-off state.

The CPU 112 executes programs loaded into the RAM 25 to thereby perform various numeric calculations and control of an information processing unit, and is equipped with the functions of the power supply controller 13 and the memory bus interface controller 14 of the memory controller 10 in FIG. 3. Further, the CPU 112 stores information on the memory controller 10, the memory devices 20' and 21' and so forth, in the RAM 25 or an HDD, not shown.

The control bus 5 is a bus for performing communication between the CPU 112 and the memory controller 10, and the CPU 112 controls the memory controller 10 via the control bus 5 using a predetermined protocol.

Figure 11:
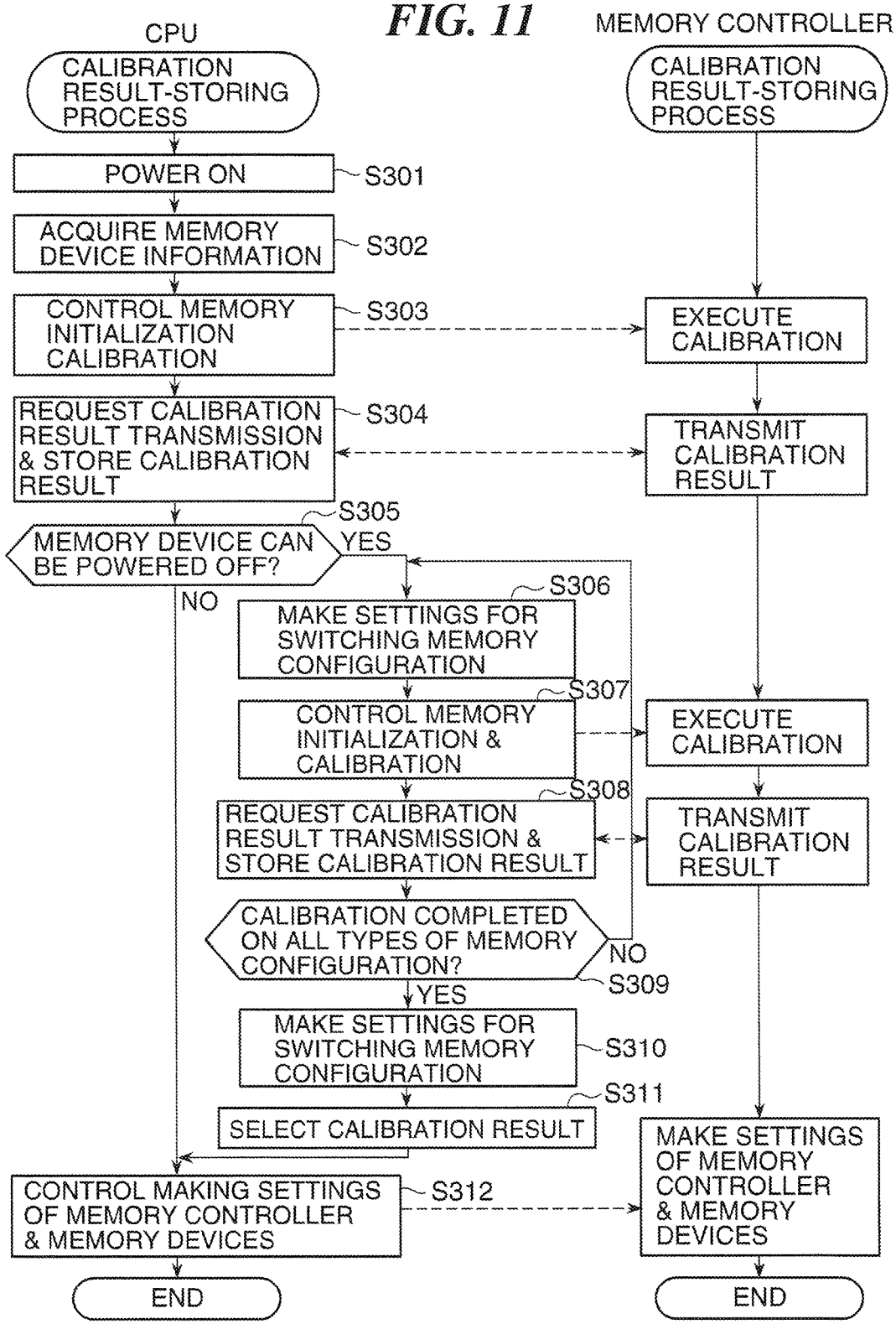
FIG. 11 is a flowchart of a calibration result-storing process executed by the CPU and the memory controller appearing in FIG. 10.

FIG. 11 is a flowchart of a calibration result-storing process executed by the CPU 112 and the memory controller 10, appearing in FIG. 10.

The calibration result-storing process in FIG. 11 is a process executed by the CPU 112 and the memory controller 10 at the startup of the multifunction peripheral 100, in which the CPU 112 stores a result of calibration performed on a memory configuration set at the startup of the multifunction peripheral 100, then stores a result of calibration performed on memory configurations other than the memory configuration set at the startup of the multifunction peripheral 100, and, after setting the memory configuration back to the one set at the startup of the multifunction peripheral 100, causes the memory controller 10 to make settings of its own and settings of the memory devices 20 and 21, using the stored calibration results.

Although in the arrangement shown in FIG. 10, it is possible to power on or off one of the memory devices 20' and 21', the following description is given assuming that only the memory device 21' is powered on or off.

Referring to FIG. 11, first, when the power is turned on at the startup of the multifunction peripheral 100, the CPU 112 sends the control signals 3 and 4 to the power switches 50 and 51, respectively, so as to simultaneously power on the power switches 50 and 51 as well (step S301). Then, the CPU 112 reads information on the memory device 20' from the SPD of the memory device 20' using the control signal 0, and similarly reads information on the memory device 21' from the SPD of the memory device 21' using the control signal 1, to thereby acquire the memory device information shown in FIG. 12 (step S302). The CPU 102 stores the acquired memory device information in the HDD, not shown, and recognizes each of the memory devices 20' and 21' as a 1-Gbit 8-bank DDR3 MRAM. Note that since the memory devices 20' and 21' are each formed by the same DDR3 MRAM, FIG. 12 shows information on the same DDR3 MRAM.

Note that the information shown in FIG. 12 is only an illustrated example, and the actual information includes necessary items other than the shown items, such as an item of a timing parameter.

Referring back to FIG. 11, the CPU 112 controls the memory controller 10 via the control bus 5 to thereby cause the same to perform memory initialization calibration on the memory module having the memory configuration set at the startup of the multifunction peripheral 100 so as to adjust both of write leveling and read leveling (step S303, which corresponds to an operation of a calibration unit). In this example, the memory module is formed by the memory devices 20' and 21'.

Then, the CPU 112 requests the memory controller to send skew values between the CLK and DQS signals as to each bank of the memory devices 20' and 21' during write access and read access, and read latency values, as the calibration result shown in FIG. 13, stores the calibration result sent from the memory controller 10 in the HDD, not shown (step S304), and determines based on the required memory capacity whether or not one of the memory devices 20' and 21' can be powered off so as to reduce power consumption (step S305).

If it is determined in the step S305 that one of the memory devices 20' and 21' can be powered off, similarly to the calibration result-storing process in FIG. 4, the CPU 112 makes settings for switching the memory configuration, described hereinabove with reference to FIG. 7, based on the memory device information acquired in the step S302, using the control signals 2, 3, and 4, so as to perform calibration on memory configurations other than the one set at the startup of the multifunction peripheral 100 (step S306).

In the present embodiment, the CPU 112 controls the control signals 2 and 4 to thereby set the respective two types of memory configuration for the standby mode and the normal operation mode, in the settings shown in FIG. 7. The bus switch 30 performs termination processing of the terminal of the memory bus 42 inside the bus switch 30 so as to ensure the signal quality of the memory buses 40 and 41 when the memory configuration is set to the one for the standby mode in which only the memory device 20' is in the power-on state.

Referring back to FIG. 11, the CPU 112 memory controller 10 controls the memory controller 10 via the control bus 5 to thereby cause the same to perform memory initialization and calibration on each of the memory devices 20' and 21' (step S307), and requests the memory controller 10 to send a calibration result back to the CPU 112, whereby the CPU 112 stores, for example, the calibration result as shown in FIG. 14, which has been obtained on the memory configuration in which only the memory device 20' is in the power-on state and has been sent from the memory controller 10, in the HDD, not shown (step S308). When calibration has been completed on all types of the memory configuration in which the memory devices 20' and 21' are powered on and off, off and on, and on and on, respectively (YES to a step S109), the memory controller 10 makes settings for switching the memory configuration so as to set the memory configuration back to the one set at the startup of the multifunction peripheral 100 using the same method as used in the step S306 (step S310).

In a step S311 following the step S310, the CPU 112 selects a calibration result on the memory configuration adapted to the standby mode or the normal operation mode, out of the stored calibration results (for example, when the memory configuration for the standby mode is set at the startup, the CPU 112 selects the calibration result in FIG. 14, which is a result of calibration performed on the memory configuration for the standby mode), and controls the memory controller 10 via the control bus 5 to thereby cause the same to make settings of its own and settings of the memory devices 20' and 21', using the selected calibration result (step S312, which corresponds to an operation of a setting control unit), followed by terminating the present process.

If it is determined in the step S305 that neither of the memory devices 20' and 21' can be powered off, the CPU 112 is not required to switch the memory configuration during operation of the multifunction peripheral 100, and hence immediately execute the step S312, followed by terminating the preset process.

According to the calibration result-storing process in FIG. 11, the result of calibration executed on the memory configuration set at the startup of the multifunction peripheral 100 (FIG. 13) and the result of calibration executed on the other memory configuration(s) than the memory configuration set at the startup of the multifunction peripheral 100 (FIG. 14) are stored, respectively (step S304 and S308), and the settings of the memory controller 10 and the settings of the memory devices 20' and 21' are made using, out of the stored calibration results, the result of calibration executed on the memory configuration adapted to the standby mode or the normal operation mode (step S312). Therefore, it is possible to omit calibration time conventionally required when switching of the memory configuration is executed which is involved in switching of the operation mode of the multifunction peripheral 100 during operation thereof after startup, as described hereinabove with reference to FIG. 9.

For example, in the step S311, similarly to the step S111 in FIG. 4, the CPU 112 selects timing parameters (i.e. skew values) each of which have the maximum margins in write access and read access, respectively, out of a plurality of skew values between the CLK and DQS signals during write access and read access, which form the calibration result in FIG. 14.

Further, although in the process in FIG. 11, whether or not to power off one of the memory devices 20' and 21' is determined based on the memory capacity of the acquired memory device information (step S302), this may be determined based on the types of the memory devices 20' and 21' or a setting set in advance in an operation mode-setting register provided in the CPU 112 or the memory controller 10. In other words, when the memory device information shown in FIG. 12 can be acquired, the determination may be made based on the acquired information, whereas when such memory device information is not available, the determination may be made based on a setting set in the operation mode-setting register provided in the CPU 112 or the memory controller 10.

Figure 15:
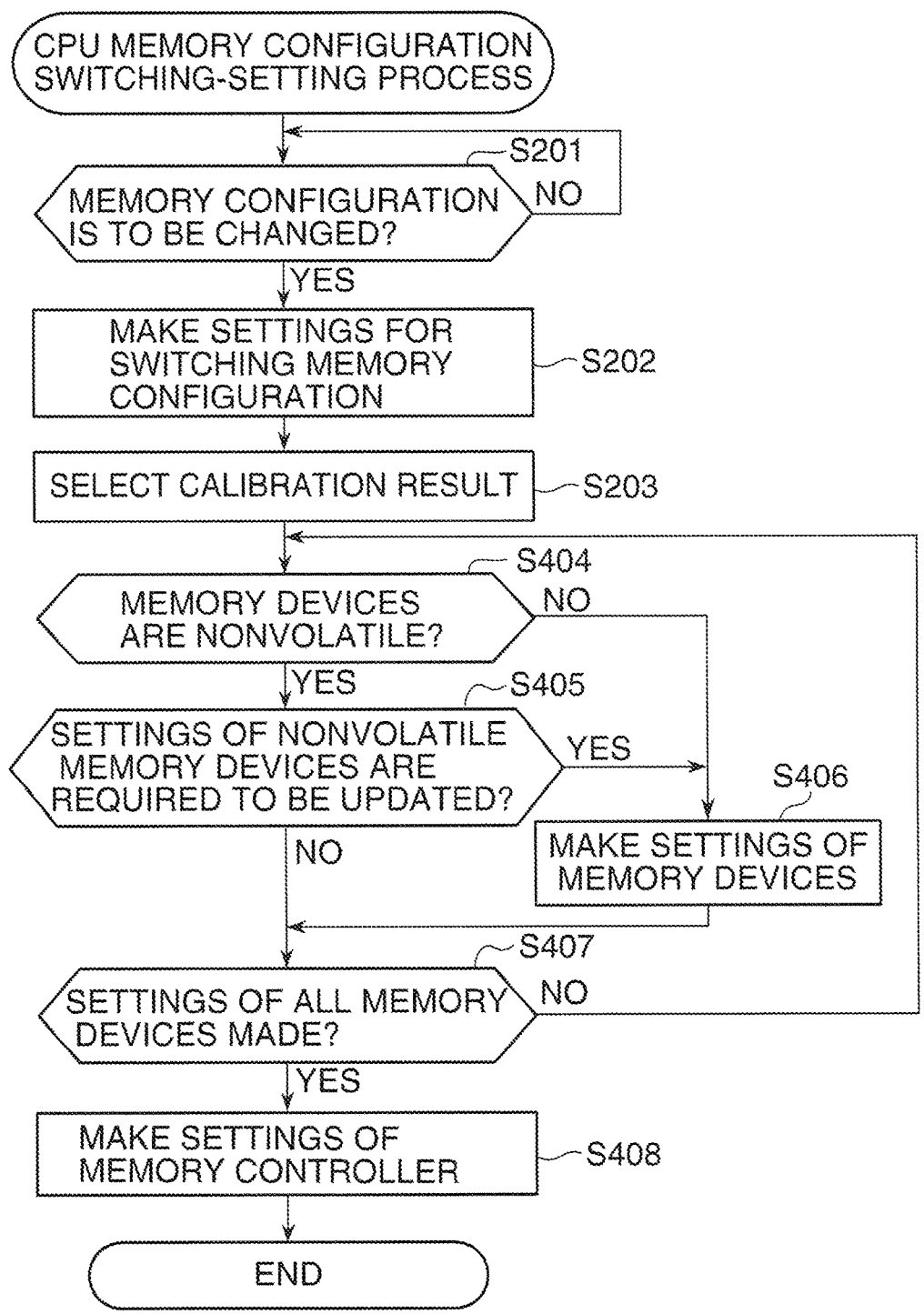
FIG. 15 is a flowchart of a CPU memory configuration switching-setting process executed by the CPU appearing in FIG. 10.

FIG. 15 is a flowchart of a CPU memory configuration switching-setting process performed by the CPU 112 appearing in FIG. 10.

The CPU memory configuration switching-setting process in FIG. 15 is a process performed when the power supply settings of the memory devices 20' and 21' are changed by the CPU 112 during operation of the multifunction peripheral 100 after startup.

The following description will be given of a case where the CPU 112 changes the power supply settings for the standby mode to those for the normal operation mode, by way of example.

Referring to FIG. 15, in steps S201 to S203 therein, the same processing as performed in each of the steps S201 to S203 in FIG. 9 is performed, and when the CPU 112 determines, based on the control signals 0 and 1 output to the CPU 112, that the memory configuration is required to be switched from one for the standby mode to one for the normal operation mode, (YES to the step S201), the CPU 112 makes the settings for switching the memory configuration based on the control signals 2 and 4 (step S202), and selects a calibration result on the memory configuration for the normal operation mode out of the calibration results stored in the step S304 or S308 in FIG. 11 (step S203).

Let it be assumed, for example, that the multifunction peripheral 100 is temporarily powered off e.g. due to a power failure, and then the power supply is restored to cause the multifunction peripheral 100 to be powered on (during this process, the power supply to the memory module is sequentially changed to on, off, and on). In a case where the memory module is all composed of the nonvolatile memory devices, each memory device holds data before the multifunction peripheral 100 is powered off, and hence the CPU 112 assumes that after the recovery of the power supply, processing is to be executed with the same settings as those set before power-off of the multifunction peripheral 100, and preserves the settings of the nonvolatile memory devices before the temporary power-off of the multifunction peripheral 100. On the other hand, in a case where the memory module includes a volatile memory device, since the volatile memory device cannot hold data stored therein before the power-off, the CPU 112 assumes that after the recovery of the power supply, processing is to be executed with the different settings from those set before the power-off of the multifunction peripheral 100, and makes settings of each memory device anew. To cope with this, in a step S404, the CPU 112 determines whether or not the memory devices 20' and 21' which are to be powered on in the memory configuration set in the step S202 are nonvolatile memory devices, respectively, and in a step S405 following the step S404, the CPU 112 determines whether or not the settings of the nonvolatile memory device(s) are required to be updated.

For example, in the steps S404 and S405, if the calibration results on the memory configurations selected before and after the temporary power-off of the multifunction peripheral 100 are the same, the CPU 112 determines that the memory module is all composed of the nonvolatile memory devices and determines that the settings of the nonvolatile memory devices are not required to be updated. On the other hand, if the selected calibration results are different from each other, the CPU 112 determines that the memory module includes a volatile memory device, and the settings of the nonvolatile memory device(s) are required to be updated.

In a case where it is determined in the step S404 that the memory devices 20' and 21' which are to be powered on in the normal operation mode are nonvolatile memory devices, and it is also determined in the step S405 that the settings of the nonvolatile memory devices are not required to be updated, when all the settings of the memory devices 20' and 21' have been made (YES to a step S407), the CPU 112 controls the memory controller 10 via the control bus 5 to thereby cause the same to make settings of its own using the calibration result on the memory configuration for the normal operation mode selected in the step S203 (step S408), followed by terminating the present process.

If it is determined in the step S404 that at least one of the memory devices 20' and 21' which are to be powered on in the normal operation mode is a volatile memory device, or it is determined in the step S405 that the settings of the nonvolatile memory device(s) are required to be updated, the CPU 112 controls the memory controller 10 via the control bus 5 to thereby cause the same to make settings of the memory devices 20' and 21' using the calibration result on the memory configuration for the normal operation mode selected in the step S203 (step S406), and executes the step S407 et seq., followed by terminating the present process.

In contrast to the above description given of the case where the CPU 112 changes the power supply settings for the standby mode to those for the normal operation mode, by way of example, in a case where the memory controller 10 changes the power supply settings for the normal operation mode to those for the standby mode, the CPU 112 selects a calibration result on the memory configuration for the standby mode out of the calibration results stored in the step S304 or S308 in FIG. 11 (step S203), executes the steps S404 and S405, and controls the memory controller 10 via the control bus 5 to thereby cause the same to make settings of the memory devices 20' and 21' using the calibration result on the memory configuration for the standby mode selected in the step S203 (step S406). Further, if it is determined in the step S404 and S405 that at least one of the memory devices 20' and 21' which are in the power-on state in the normal operation mode is a volatile memory device, or the settings of the nonvolatile memory device(s) are required to be updated, the CPU 112 controls the memory controller 10 via the control bus 5 to thereby cause the same to make settings of the memory devices 20' and 21' using the calibration result on the memory configuration for the normal operation mode selected in the step S203 (step S406).

According to the CPU memory configuration switching-setting process in FIG. 15, the settings of the memory controller 10 are made using the calibration result on the memory configuration adapted to the standby mode or the normal operation mode out of the calibration results stored at the startup of the multifunction peripheral 100 (step S408), and hence it is possible to reduce the calibration time even when the power supply settings of the memory devices 20' and 21' are changed during operation of the multifunction peripheral 100.

In the CPU memory configuration switching-setting process in FIG. 15, only when at least one of the memory devices 20' and 21' which are in the power-on state in the normal operation mode is a volatile memory device, or the settings of the nonvolatile memory device are required to be updated (NO to the step S404 or S405), the settings of the memory devices 20' and 21' are made using the result of calibration executed on the memory configuration adapted to the standby mode or the normal operation mode, out of the calibration results stored at the startup of the multifunction peripheral 100, and hence it is possible to simplify setting of the memory devices 20' and 21'.

Further, although in the CPU memory configuration switching-setting process in FIG. 15, it is assumed that calibration is executed at the time of power-on (step S303 and S307 in FIG. 11), in a case where the power supply settings are changed by the CPU 112 during operation of the multifunction peripheral 100 after startup, if, in such a case, the memory device information is found to have been changed when the information is read from the respective SPDs of the memory devices 20' and 21' in the power-on state, calibration may be executed again to thereby update the calibration results.

Further, the step S406 in which the settings of the memory devices 20' and 21' are made and the step S408 in which the settings of the memory controller 10 are made may be simultaneously executed.

Next, a description will be given of a job process including the CPU memory configuration switching-setting process executed by the multifunction peripheral 100 according to the variation of the present embodiment.

Figure 16:
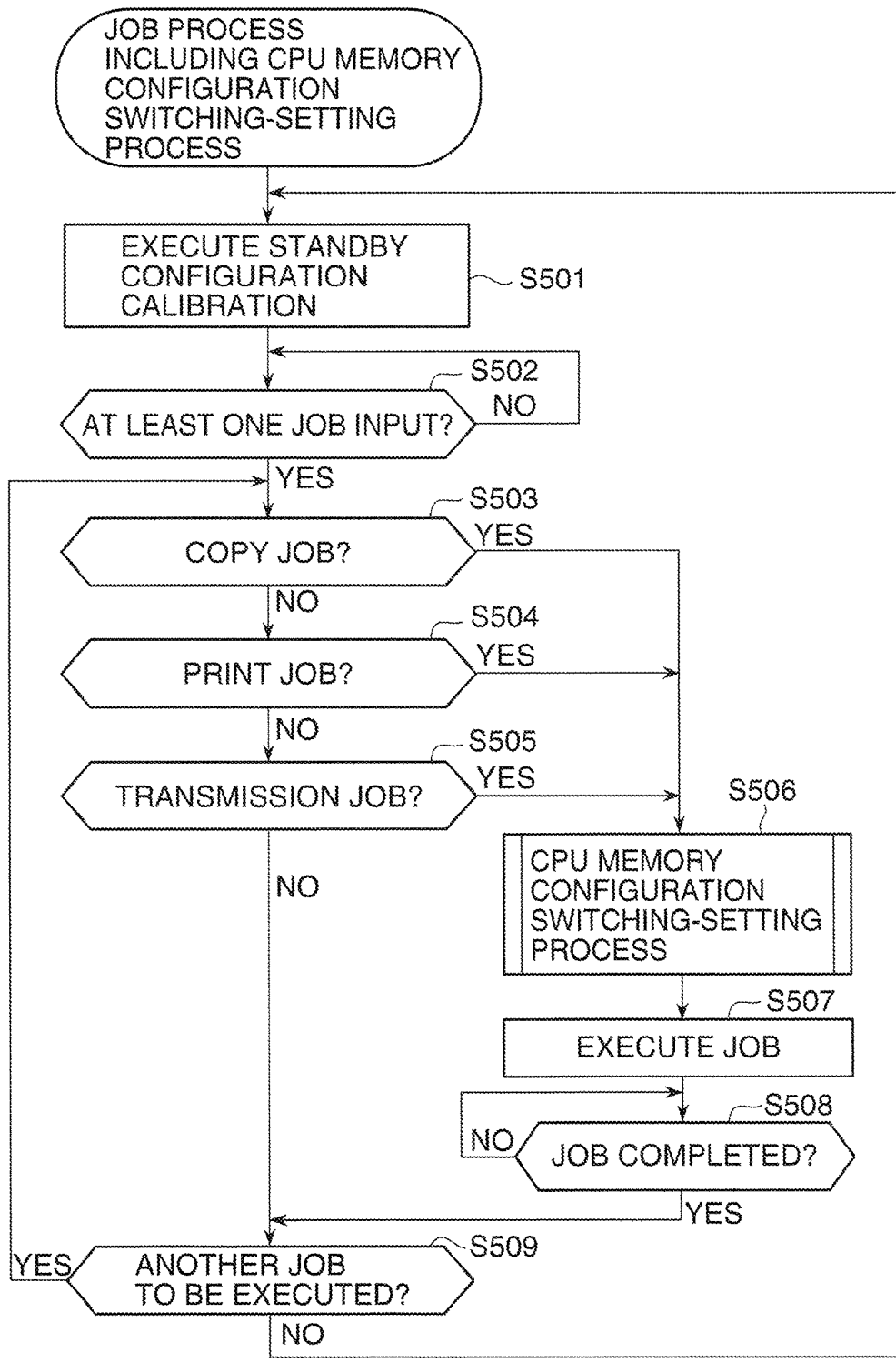
FIG. 16 is a flowchart of a job process including the CPU memory configuration switching-setting process executed by a controller unit including the CPU and the memory controller appearing in FIG. 10.
Figure 17A:
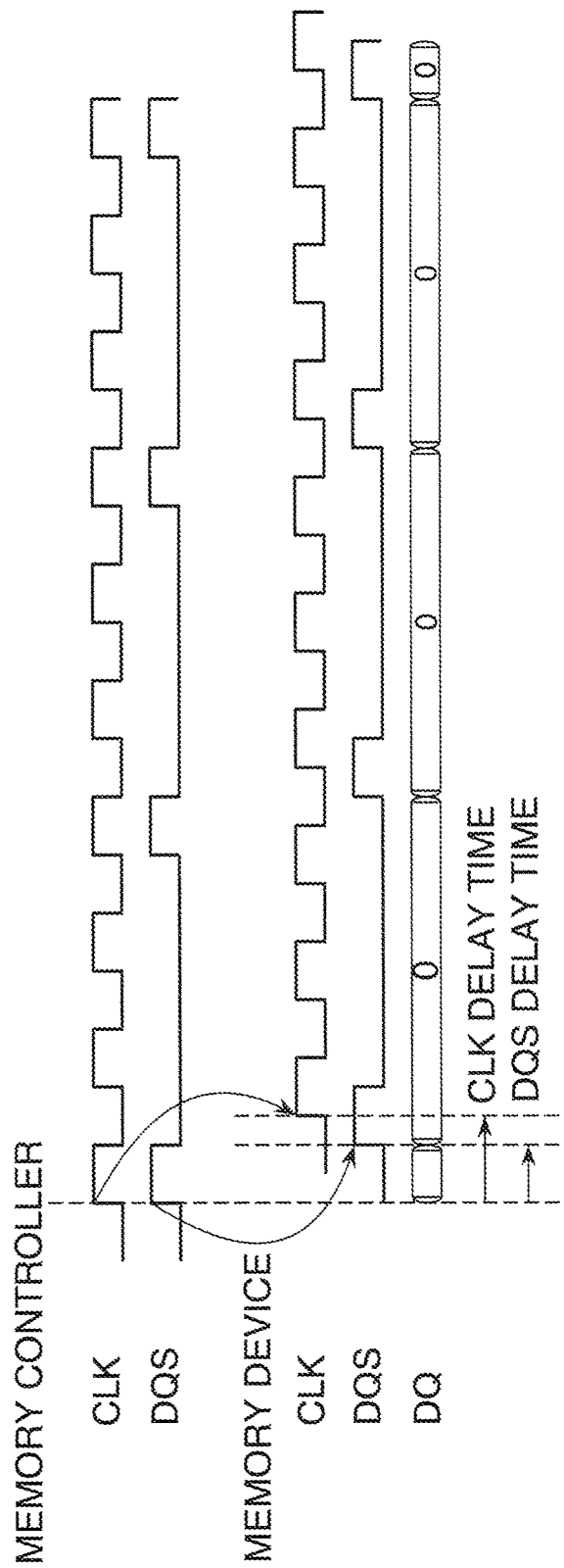
FIG. 17A is a timing diagram of CLK and DQS signals in each of the memory controller and the memory device before the memory controller performs timing adjustment.
Figure 17B:
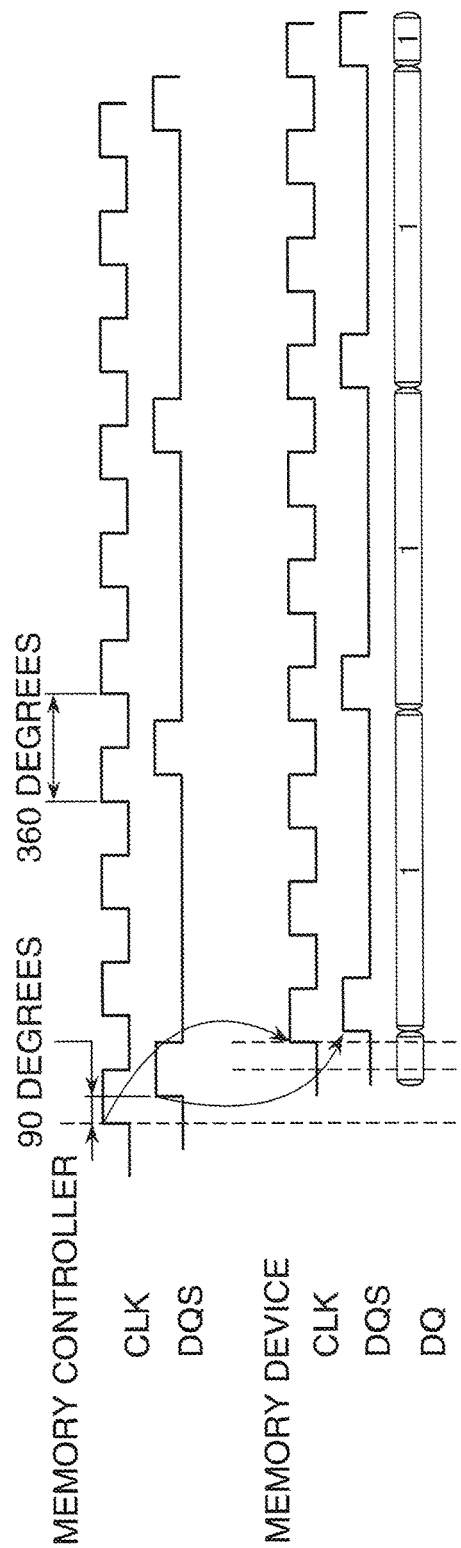
FIG. 17B is a timing diagram of the CLK and DQS signals in each of the memory controller and the memory device after the memory controller has performed timing adjustment.

FIG. 16 is a flowchart of the job process including the CPU memory configuration switching-setting process executed by the controller unit 101 including the CPU 112 and the memory controller 10 appearing in FIG. 10.

When a copy job, a print operation, or a transmission operation is executed by the multifunction peripheral 100, the memory capacity of the work memory required for the controller unit 101 of the multifunction peripheral 100 to temporarily store a file and the like is different depending on each of the above-mentioned jobs, and hence the controller unit 101 makes judgment on the switching of the memory configuration and settings for switching the memory configuration, for each of the above-mentioned jobs The copy job is a job of reading an image by a scanner, not shown, from an original placed on a feeder, not shown, of the multifunction peripheral 100, performing image processing, such as color conversion processing, density conversion processing, edge emphasizing processing, and screen processing, on the read image internally by the controller unit 101, forming the processed image on a sheet by the printer section 102, and outputting the sheet.

The print job is a job of receiving image data, such as PDL data and JPEG data, from an external interface, not shown, connected to a PC or a USB device, performing image processing, such as rendering processing, color conversion processing, density conversion processing, edge emphasizing processing, and screen processing, on the received image data internally by the controller unit 101, forming the processed image on a sheet by the printer unit 102, and outputting the sheet.

The transmission job is a job of reading an image by the scanner from an original placed on the feeder of the multifunction peripheral 100, performing image processing, such as color conversion processing, density conversion processing, edge emphasizing processing, and screen processing, on the read image internally by the controller unit 101, to thereby generate a JPEG file or the like, and further transmitting the file to a designated E-mail address via a network.

Referring to FIG. 16, first, when the power is turned on at the startup of the multifunction peripheral 100, the CPU 112 as a component of the controller unit 101 sets the memory configuration to the one for the standby mode, executes the calibration in the step S303 in FIG. 11, and maintains the memory configuration until at least one job is input (step S501).

Then, when at least one job is input (YES to a step S502), the CPU 112 determines whether or not a job to be executed of the at least one job is a copy job (step S503), or a print job (step S504), or a transmission job (step S505).

If it is determined in one of the steps S503, S504, and S505 that the job to be executed is a copy job, a print job, or a transmission job, the CPU 112 executes processing in the steps S201 to S408 in FIG. 15 (CPU memory configuration switching-setting process) according to the type of the job (step S506), and then executes the job (step S507).

Next, it is determined whether the execution of the job is completed (step S508), and this determination is repeated until the execution of the job is completed. If it is determined that the execution of the job is completed (YES to the step S508), or if it is determined in the steps S503, S504, and S505 that the job is none of the copy job, print job and the transmission job, the CPU 112 determines whether or not there is another job to be executed (step S509), and if it is determined in the step S508 that there is another job to be executed, the CPU 112 returns to the step S503, whereas if not, the CPU 112 returns to the step S501, and sets the memory configuration to the one for the standby mode.

For example, in a case where it is determined in the step S503 that the job to be executed is a copy job, the CPU 112 calculates a work memory area based on a sheet size, etc., so as to temporarily store scanned data, and when it is judged, based on the memory device information acquired in the step S302 in FIG. 11, that the required work memory capacity cannot be met by the memory device 20' alone, the CPU 112 switches the memory configuration for the standby operation mode to the one for the normal operation mode.

If it is determined in the step S504 that the job to be executed is a print job, the CPU 112 calculates a work memory area based on a sheet size, etc., so as to temporarily store data for rendering PDL data, and when it is judged, based on the memory device information acquired in the step S302 in FIG. 11, that the required work memory capacity cannot be met by the memory device 20' alone, the CPU 112 switches the memory configuration for the standby operation mode to the one for the normal operation mode.

If it is determined in the step S505 that the job to be executed is a transmission job, the CPU 112 calculates a work memory area based on a sheet size, etc., so as to temporarily store scanned data, and when it is judged, based on the memory device information acquired in the step S302 in FIG. 11, that the required work memory capacity can be met by the memory device 20' alone, the CPU 112 does not switch the memory configuration for the standby operation mode.

According to the job process including the CPU memory configuration switching-setting process in FIG. 16, the settings of the memory controller 10 and the settings of the memory devices 20' and 21' are made using a calibration result on the memory configuration adapted to the type of an input job, which is selected from the calibration results stored at the startup of the multifunction peripheral 100 (step S506), and hence it is possible to reduce the calibration time even when the power supply control is executed during operation of the multifunction peripheral 100.

Other Embodiments

Embodiments of the present invention can also be realized by a computer of a system or apparatus that reads out and executes computer executable instructions recorded on a storage medium (e.g., non-transitory computer-readable storage medium) to perform the functions of one or more of the above-described embodiment(s) of the present invention, and by a method performed by the computer of the system or apparatus by, for example, reading out and executing the computer executable instructions from the storage medium to perform the functions of one or more of the above-described embodiment(s). The computer may comprise one or more of a central processing unit (CPU), micro processing unit (MPU), or other circuitry, and may include a network of separate computers or separate computer processors.

The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

REFERENCE SIGNS LIST

10 memory controller
11 memory device information acquisition section
12 setting storage section
13 power supply controller
14 memory bus interface controller
20, 21, 20', 21' memory device
30 bus switch
40, 41, 42 memory bus
50, 51 power switch
112 CPU

The invention claimed is:

1. A memory controller that controls first memory device and a second memory device, comprising:
  a power supply control unit configured to control power supply to the first memory device and the second memory device;
  a storage unit configured to store a first setting value for adjusting writing timing in a first power state of writing of data in the first memory device, or reading timing in the first power state of reading of data from the first memory device, the first power state indicating a state where the power is supplied to the first memory device and the second memory device, and a second setting value for adjusting a writing timing in a second power state of writing of data in the first memory device, or a reading timing in the second power state of reading of data from the first memory device, the second power state indicating a state where the power is supplied to the first memory device while the power supply to the second memory is stopped; and
  a control unit configured to control, in the first power state, the writing timing of the writing of data in the first memory device or the reading timing of the reading of data from the first memory device based on the first setting value stored in the storage unit, and control, in the second power state, the writing timing of the writing of data in the first memory device, or the reading timing of the reading of data from the first memory device, based on the second setting value stored in the storage unit.

2. The memory controller according to claim 1, further comprising a memory device information acquisition unit configured to acquire information on the plurality of memory devices, and
  wherein said power supply control unit controls power supply to the first memory device and the second memory device based on the memory device information acquired by said memory device information acquisition unit.

3. The memory controller according to claim 2, wherein the memory device information includes a memory capacity of the first memory device and a memory capacity of the second memory device.

4. The memory controller according to claim 2, wherein the memory device information includes types of the plurality of memory devices.

5. The memory controller according to claim 1, wherein the first memory device and the second memory device are disposed on a single bus.

* * * * *